United States Patent
Maruyama

(10) Patent No.: US 11,521,960 B2
(45) Date of Patent: Dec. 6, 2022

(54) TERMINAL PROTECTION CIRCUIT OF SEMICONDUCTOR CHIP

(71) Applicant: FUJI ELECTRIC CO., LTD., Kawasaki (JP)

(72) Inventor: Hiroshi Maruyama, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 62 days.

(21) Appl. No.: 17/104,995

(22) Filed: Nov. 25, 2020

(65) Prior Publication Data
US 2021/0225833 A1     Jul. 22, 2021

(30) Foreign Application Priority Data

Jan. 17, 2020  (JP) .............................. JP2020-005547

(51) Int. Cl.
*H01L 27/02* (2006.01)
*H01L 23/62* (2006.01)
*H01L 23/528* (2006.01)

(52) U.S. Cl.
CPC ........ *H01L 27/0255* (2013.01); *H01L 23/528* (2013.01); *H01L 23/5286* (2013.01); *H01L 23/62* (2013.01); *H01L 27/02* (2013.01); *H01L 27/0266* (2013.01)

(58) Field of Classification Search
CPC ....... H01L 27/02; H01L 23/528; H01L 23/62; H01L 27/0255; H01L 23/5286; H01L 27/0266; H01L 27/0292; H01L 27/027; H01L 27/0727; G05F 1/00; G05F 1/573; H02H 5/048

USPC .............................. 361/56, 86–87, 93.7–93.9
See application file for complete search history.

(56) References Cited

U.S. PATENT DOCUMENTS

| 6,181,588 | B1* | 1/2001 | Kates | .................... H02M 7/219 363/52 |
| 2011/0175583 | A1* | 7/2011 | Thomas | .............. H03F 3/45475 323/280 |
| 2021/0006242 | A1* | 1/2021 | Takagiwa | ............. H03K 17/567 |

FOREIGN PATENT DOCUMENTS

JP       2013-062721 A      4/2013

\* cited by examiner

*Primary Examiner* — Danny Nguyen
(74) *Attorney, Agent, or Firm* — Rabin & Berdo, P.C.

(57) ABSTRACT

A terminal protection circuit of a semiconductor chip, including a first pad serving as a ground terminal of the semiconductor chip, a ground line extending along an outer periphery of the semiconductor chip and being connected to the first pad, and an overcurrent sensing circuit. The overcurrent sensing circuit has a second pad, a threshold voltage generating circuit, a comparator having inverting and non-inverting input terminals respectively connected to the threshold voltage generating circuit and the second pad, the comparator comparing a current detection signal and a threshold voltage received respectively at the non-inverting and inverting input terminals, a first input protection element connected between the second pad and a first position on the chip-peripheral ground line, and a potential shift element connected between the inverting input terminal of the comparator and the first position, for shifting the threshold voltage thereat according to a potential at the first position.

7 Claims, 7 Drawing Sheets

TERMINAL PROTECTION CIRCUIT OF SEMICONDUCTOR CHIP

CROSS-REFERENCE TO RELATED APPLICATION

This application is based upon and claims the benefit of priority of the prior Japanese Patent Application No. 2020-005547, filed on Jan. 17, 2020, the entire contents of which are incorporated herein by reference.

BACKGROUND OF THE INVENTION

1. Field of the Invention

The embodiment discussed herein relates to a terminal protection circuit of a semiconductor chip.

2. Background of the Related Art

Three-phase motors used in, for example, compressors of air conditioners are driven and controlled by motor drive devices. Such a motor drive device is a single package incorporating together power switches for controlling power to the three-phase motor, drive circuits for driving on and off the power switches, and various protection circuits.

FIG. 4 illustrates an exemplary configuration of a common motor drive device. Note that in the following the same reference symbol may be used to refer to the name of each terminal as well as a voltage, signal and the like at the terminal.

As illustrated in FIG. 4, a three-phase motor M is driven by a motor drive device formed of an intelligent power module (IPM) 100, which is controlled by a micro controller unit (MCU) 200 with a built-in microcomputer.

The IPM 100 includes power switches Q1 to Q6. In the exemplary configuration of FIG. 4, the power switches Q1 to Q6 are insulated gate bipolar transistors (IGBTs), to each of which a free wheeling diode (FWD) is connected in inverse parallel.

The power switches Q1 and Q2 are connected in series with each other, and their both ends are connected to a P terminal and an N(U) terminal, which are respectively a positive power supply terminal and a negative power supply terminal of the IPM 100. A connection point of the power switches Q1 and Q2 is connected via a U terminal of the IPM 100 to a U-phase terminal of the three-phase motor M. The power switches Q3 and Q4 are connected in series with each other, and their both ends are connected to the P terminal and an N(V) terminal, which is a negative power supply terminal, of the IPM 100. A connection point of the power switches Q3 and Q4 is connected via a V terminal of the IPM 100 to a V-phase terminal of the three-phase motor M. The power switches Q5 and Q6 are connected in series with each other, and their both ends are connected to the P terminal and an N(W) terminal, which is a negative power supply terminal, of the IPM 100. A connection point of the power switches Q5 and Q6 is connected via a W terminal of the IPM 100 to a W-phase terminal of the three-phase motor M.

The gates of the high-side power switches Q1, Q3, and Q5 are individually connected to output terminals of high-voltage side control circuits HV-IC(U), HV-IC(V), and HV-IC(W). Input terminals of the high-voltage side control circuits HV-IC(U), HV-IC(V), and HV-IC(W) are individually connected via IN(HU), IN(HV), and IN(HW) of the IPM 100 to an HU terminal, an HV terminal, and an HW terminal of the MCU 200.

The gates of the low-side power switches Q2, Q4, and Q6 are individually connected to a UOUT terminal, a VOUT terminal, and a WOUT terminal of a low-voltage side control circuit LV-IC. The low-voltage side control circuit LV-IC includes a VCC terminal, a GND terminal, a TEMP terminal, an IS terminal, a CFO terminal, a VFO terminal, a UIN terminal, a VIN terminal, and a WIN terminal.

The VCC terminal of the low-voltage side control circuit LV-IC is connected via a VCCL terminal of the IPM 100 to positive electrode terminals of a power source E1 and a capacitor C1. Negative electrode terminals of the power source E1 and the capacitor C1 are connected to a GND terminal of the MCU 200 and a negative power supply terminal to which the N(U) terminal, N(V) terminal, and N(W) terminal of the IPM 100 are connected. The GND terminal of the low-voltage side control circuit LV-IC is connected via a COM terminal of the IPM 100 to the GND terminal of the MCU 200 and the negative power supply terminal. Note that the power source E1 of the low-voltage side control circuit LV-IC is connected to a bootstrapped circuit (not illustrated) so that power source voltages of the high-voltage side control circuits HV-IC(U), HV-IC(V), and HV-IC(W) based on the potentials of the N(U) terminal, N(V) terminal, and N(W) terminal of the IPM 100 are individually generated. Herewith, the high-voltage side control circuits HV-IC(U), HV-IC(V), and HV-IC(W) shift levels of signals fed from the MCU 200 to output voltages to drive the high-side power switches Q1, Q3, and Q5.

The TEMP terminal of the low-voltage side control circuit LV-IC is an output terminal of an overheat protection circuit, and is connected via a TEMP terminal of the IPM 100 to a TEMP terminal of the MCU 200. The IS terminal is an input terminal of an overcurrent sensing circuit for detecting overcurrent flowing through the power switches Q1 to Q6, and is connected to an IS terminal of the IPM 100. The low-side power switches Q2, Q4, and Q6 are formed of IGBTs each with a current sensing terminal, configured to divert a fixed proportion of current flowing from its collector into an emitter different from an emitter through which the main current flows. The currents of the current sensing terminals of the power switches Q2, Q4, and Q6 are collected at a VSC terminal of the IPM 100 and returned back to the negative power supply terminal via an externally connected current sensing resistor RIS. The VSC terminal of the IPM 100 is connected via a series circuit composed of a resistor Rn and a capacitor Cn to the negative power supply terminal, and a connection point of the resistor Rn and the capacitor Cn is connected to the IS terminal of the IPM 100. Herewith, the currents output from the current sensing terminals of the power switches Q2, Q4, and Q6 are converted by the current sensing resistor RIS into voltage. After noise is removed from the converted voltage by the resistor Rn and the capacitor Cn, the voltage is input to the overcurrent sensing circuit of the low-voltage side control circuit LV-IC.

The VFO terminal of the low-voltage side control circuit LV-IC is an output terminal for outputting a fail signal which indicates an abnormal state detected in an internal protection circuit, and is connected via a VFO terminal of the IPM 100 to a VFO terminal of the MCU 200. The VFO terminals of the IPM 100 and the MCU 200 are connected via a pull-up resistor Rp to positive electrode terminals of a power source E2 and a capacitor C2. The positive electrode terminals of the power source E2 and the capacitor C2 are also connected to a VDD terminal of the MCU 200. Negative electrode terminals of the power source E2 and the capacitor C2 are connected to the negative power supply terminal and the GND terminal of the MCU 200. When a protection circuit of the low-voltage side control circuit LV-IC outputs no fail signal indicating an abnormal state, a high (H) level signal that has been pulled up by the pull-up resistor Rp is input to the VFO terminal of the MCU 200. When the protection circuit of the low-voltage side control circuit LV-IC is outputting a fail signal, on the other hand, a low (L) level fail signal is input to the VFO terminal of the MCU 200. In addition, when outputting the L-level fail signal, the low-voltage side control circuit LV-IC turns off the low-side power switches Q2, Q4, and Q6.

The CFO terminal of the low-voltage side control circuit LV-IC is connected via a CFO terminal of the IPM 100 to a first terminal of an externally connected capacitor Cfo, whose second terminal is connected to the negative power supply terminal. The capacitor Cfo is configured to set the minimum output width for the L-level fail signal, and the minimum output width is set by detecting that a terminal voltage of the capacitor Cfo has reached a predetermined voltage when the capacitor Cfo is charged at constant current. When recovery from an abnormal state is made after the fail signal falls below the minimum output width, the low-voltage side control circuit LV-IC is able to drive the low-side power switches Q2, Q4, and Q6 again.

The UIN, VIN, and WIN terminals of the low-voltage side control circuit LV-IC are input terminals to receive, from the MCU 200, signals for controlling the power switches Q2, Q4, and Q6. The UIN, VIN, and WIN terminals are respectively connected via IN(LU), IN(LV), and IN(LW) terminals of the IPM 100 to LU, LV, and LW terminals of the MCU 200.

The VCC, TEMP, IS, CFO, VFO, UIN, VIN, and WIN terminals of the low-voltage side control circuit LV-IC are provided with terminal protection circuits which prevent input and output terminals from being subjected to excessive voltage caused by electrostatic discharge, lightning surge propagation, or the like. Next described are specific examples of the terminal protection circuits.

FIG. 5 is a circuit diagram illustrating exemplary terminal protection circuits of the low-voltage side control circuit. FIG. 6 illustrates an exemplary arrangement on a semiconductor chip of the low-voltage side control circuit. FIG. 7 illustrates operation waveforms of the terminal protection circuits in response to application of an overvoltage. Note that FIG. 7 depicts, from the top to the bottom, a voltage V_CFO of the CFO terminal; a current Ip flowing into the CFO terminal when the overvoltage is applied; a potential VB at Point B; a potential VA at Point A; and an overcurrent detection signal OCP.

In the low-voltage side control circuit LV-IC, metal-oxide-semiconductor field-effect transistors (MOSFETs) each with the gate connected to the source are used as the terminal protection circuits for the VCC, IS, VFO, UIN, VIN, and WIN terminals, and Zener diodes are used as the terminal protection circuits for the TEMP and CFO terminals. FIG. 5 depicts exemplary circuit geometry around the IS and CFO terminals. FIG. 6 represents exemplary arrangement of the GND, IS, CFO, VFO, and UIN terminals on the semiconductor chip.

In the circuit geometry illustrated in FIG. 5, the IS terminal is connected via a current-limiting protection resistor R1 to a non-inverting input terminal of a comparator COMP_IS. To an inverting input terminal of the comparator COMP_IS, a threshold voltage VthIS is applied. The threshold voltage VthIS is obtained by dividing a voltage Vreg generated within the low-voltage side control circuit LV-IC by voltage dividing resistors Rd1 and Rd2. The comparator COMP_IS forms, together with the voltage dividing resistors Rd1 and Rd2, an overcurrent sensing circuit that outputs the overcurrent detection signal OCP of H level when the current of the power switches Q2, Q4, and Q6 exceeds a current corresponding to the threshold voltage VthIS.

At Point A where the protection resistor R1 and the non-inverting input terminal of the comparator COMP_IS are connected to each other, a terminal protection circuit made up of transistors MN1 and MP1 is provided. The transistor MN1 is an N-channel MOSFET whose drain is connected to Point A and gate and source are connected to Point B on a chip-peripheral ground line 11. Note that a diode PD1 which is connected to the drain and source of the transistor MN1 is a parasitic diode of the transistor MN1. The transistor MP1 is a P-channel MOSFET whose drain is connected to Point A and gate and source are connected to the VCC terminal of the low-voltage side control circuit LV-IC. The transistor MP1 also has a parasitic diode (not illustrated). To the VCC terminal, a terminal protection circuit formed of MOSFETs (not illustrated) is connected for electrostatic discharge protection.

When a positive overvoltage exceeding the voltage of the VCC terminal is applied to the IS terminal, the overvoltage passes through the protection resistor R1, is then supplied via the parasitic diode of the transistor MP1 to the VCC terminal, and is clamped at a predetermined voltage by the terminal protection circuit of the VCC terminal. Therefore, the voltage at Point A is controlled to a level obtained by adding the forward voltage of the parasitic diode of the transistor MP1 to the clamp voltage of the terminal protection circuit of the VCC terminal.

On the other hand, when a negative overvoltage is applied to the IS terminal, a path is formed through which a current flows from Point B via the parasitic diode of the transistor MN1 and the protection resistor R1 to the IS terminal. At this time, the voltage at Point A is controlled to a level obtained by adding the forward voltage of the parasitic diode of the transistor MN1 to the voltage at Point B.

The CFO terminal of the low-voltage side control circuit LV-IC is connected to the cathode of a Zener diode ZD1, whose anode is connected to Point C, which is located on the peripheral ground line 11 further away from the GND terminal than Point B. The CFO terminal is also connected to an output terminal of a pulse width setting circuit that sets the minimum output width for the fail signal. In the example of FIG. 5, the pulse width setting circuit includes transistors MP11 and MP12, resistors R11 and R12, and a transistor MN11. The drain and gate of the transistor MP11 are connected to a constant current generating circuit (not illustrated), and the source thereof is connected to a line of a power source vdd. As for the transistor MP12, the source is connected to the line of the power source vdd, the gate is connected to the drain and gate of the transistor MP11, and the drain is connected to a first terminal of the resistor R11. The other second terminal of the resistor R11 is connected to a first terminal of the resistor R12, a CFO terminal voltage measuring circuit, and the drain of the discharge control transistor MN11 while the other second terminal of the resistor R12 is connected to the CFO terminal.

In this situation, when an overvoltage is applied to the CFO terminal, the overvoltage is clamped at a breakdown voltage of the Zener diode ZD1. This prevents a voltage higher than the breakdown voltage of the Zener diode ZD1 from being applied to the pulse width setting circuit connected to the CFO terminal.

The chip-peripheral ground line 11 has a wiring resistance Rg1 between Point B and the GND terminal, a wiring resistance Rg2 between Point C and Point B, and a wiring resistance Rg3 on the opposite side to the GND terminal relative to Point C.

As illustrated in FIG. 6, the chip-peripheral ground line 11 extends along the outer periphery of a semiconductor chip 12 of the low-voltage side control circuit LV-IC, and a pad 13 of the GND terminal is formed as a part of the chip-peripheral ground line 11. In addition, the semiconductor chip 12 includes a pad 14 of the TEMP terminal, a pad 15 of the IS terminal, a pad 16 of the CFO terminal, a pad 17 of the VFO terminal, and a pad 18 of the UIN terminal installed inside the chip-peripheral ground line 11 extending along the upper part in FIG. 6.

A Zener diode, functioning as a terminal protection circuit, connected to the TEMP terminal which is the output terminal of an overheat protection circuit is formed in a protection circuit area 14a below the pad 14 of the TEMP terminal. Similarly, the Zener diode ZD1, functioning as a terminal protection circuit, connected to the CFO terminal is formed in a protection circuit area 16a below the pad 16 of the CFO terminal. In addition, transistors, functioning as a terminal protection circuit, connected to the UIN terminal are formed in a protection circuit area 18a where the pad 18 of the UIN terminal is formed.

The transistors MN1 and MP1 functioning as a terminal protection circuit connected to the IS terminal of the overcurrent sensing circuit are formed in a protection circuit area 15a. On the semiconductor chip 12, a threshold voltage generating circuit area 15b for generating the threshold voltage VthIS of the overcurrent sensing circuit is formed on the inside of the protection circuit area 15a. In the threshold voltage generating circuit area 15b, the voltage dividing resistors Rd1 and Rd2 are formed. A first terminal of the voltage dividing resistor Rd1 is connected to a line of the voltage Vreg while a first terminal of the voltage dividing resistor Rd2 is connected to an in-chip ground line 11a extending from the pad 13. From the other second terminals of the voltage dividing resistors Rd1 and Rd2, the threshold voltage VthIS is output.

The chip-peripheral ground line 11 has Point B located near the transistor MN1, to which the source of the transistor MN1 is connected, and Point C located near the pad 16, to which the anode of the Zener diode ZD1 is connected.

According to the overcurrent sensing circuit with the above-described configuration, when the chip-peripheral ground line 11 is viewed from the pad 13 of the GND terminal, Point C, to which the anode of the Zener diode ZD1 serving as a terminal protection circuit is connected, is located further away than Point B, to which the source of the transistor MN1 of a different terminal protection circuit is connected. Therefore, when an overvoltage (a pulsed overvoltage noise with a pulse width Tw of 1 microsecond (has) in FIG. 7) is applied to the pad 16 of the CFO terminal, the current Ip flows through the Zener diode ZD1 and then into the pad 13 of the GND terminal via the chip-peripheral ground line 11.

At this time, the high current Ip flows through the wiring resistance Rg1 between Point B and the pad 13 of the GND terminal, which results in an increase in the potential VB at Point B. When the potential VB at Point B exceeds the forward voltage of the parasitic diode of the transistor MN1, the parasitic diode of the transistor MN1 becomes conductive, and the current flows backward from Point B on the chip-peripheral ground line 11 to Point A to which the drain of the transistor MN1 is connected, which results in an increase in the potential VA at Point A. The threshold voltage VthIS at which the overcurrent sensing circuit begins to operate is generated based on the potential of the in-chip ground line 11a, which is different from the chip-peripheral ground line 11. Therefore, because being independent of the increased potential at Point B, the threshold voltage VthIS is maintained at the same level. For this reason, if the potential VA at Point A exceeds the threshold voltage VthIS, the comparator COMP_IS outputs the overcurrent detection signal OCP of H level. After that, the output is held by the comparator COMP_IS, and the low-voltage side control circuit LV-IC forcibly turns off all its outputs. Thus, the overcurrent sensing circuit is regarded as having malfunctioned.

Once the overcurrent detection signal OCP is output, the transistor MN11 of the pulse width setting circuit is turned off while the transistors MP11 and MP12 of a current mirror circuit remain on. As a result, the capacitor Cfo connected to the CFO terminal starts being charged, which results in an increase in the voltage V_CFO of the CFO terminal.

Therefore, in an overcurrent sensing circuit, in the case where the voltage of the overcurrent detection input terminal rises due to the presence of an overvoltage noise, changing the threshold voltage VthIS at the same time is sometimes employed to prevent the overcurrent sensing circuit from malfunctioning (see, for example, Japanese Laid-open Patent Publication No. 2013-062721).

However, according to the technique disclosed in Japanese Laid-open Patent Publication No. 2013-062721, thresholds of a comparator used to detect overcurrent are changed according to the magnitudes of an average load current, an alternating current change of the load current, and a power source voltage, and thus there remains the problem of not being able to cause the thresholds to respond in the event of instantaneous disturbances such as noise.

SUMMARY OF THE INVENTION

According to one aspect, there is provided a terminal protection circuit of a semiconductor chip, including: a first pad serving as a ground terminal of the semiconductor chip; a chip-peripheral ground line extending along an outer periphery of the semiconductor chip, and configured to be connected to the first pad; and an overcurrent sensing circuit, including: a second pad serving as an input terminal of the semiconductor chip, for receiving a current detection signal, a threshold voltage generating circuit for generating a threshold voltage, a comparator having an inverting input terminal and a non-inverting input terminal that are respectively connected to the threshold voltage generating circuit and the second pad, the comparator comparing the current detection signal and the threshold voltage received respectively at the non-inverting and inverting input terminals, a first input protection element connected between the second pad and a first position on the chip-peripheral ground line, and a potential shift element connected between the inverting input terminal of the comparator and the first position on the chip-peripheral ground line, the potential shift element shifting the threshold voltage to be applied to the comparator according to a potential at the first position.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 4:
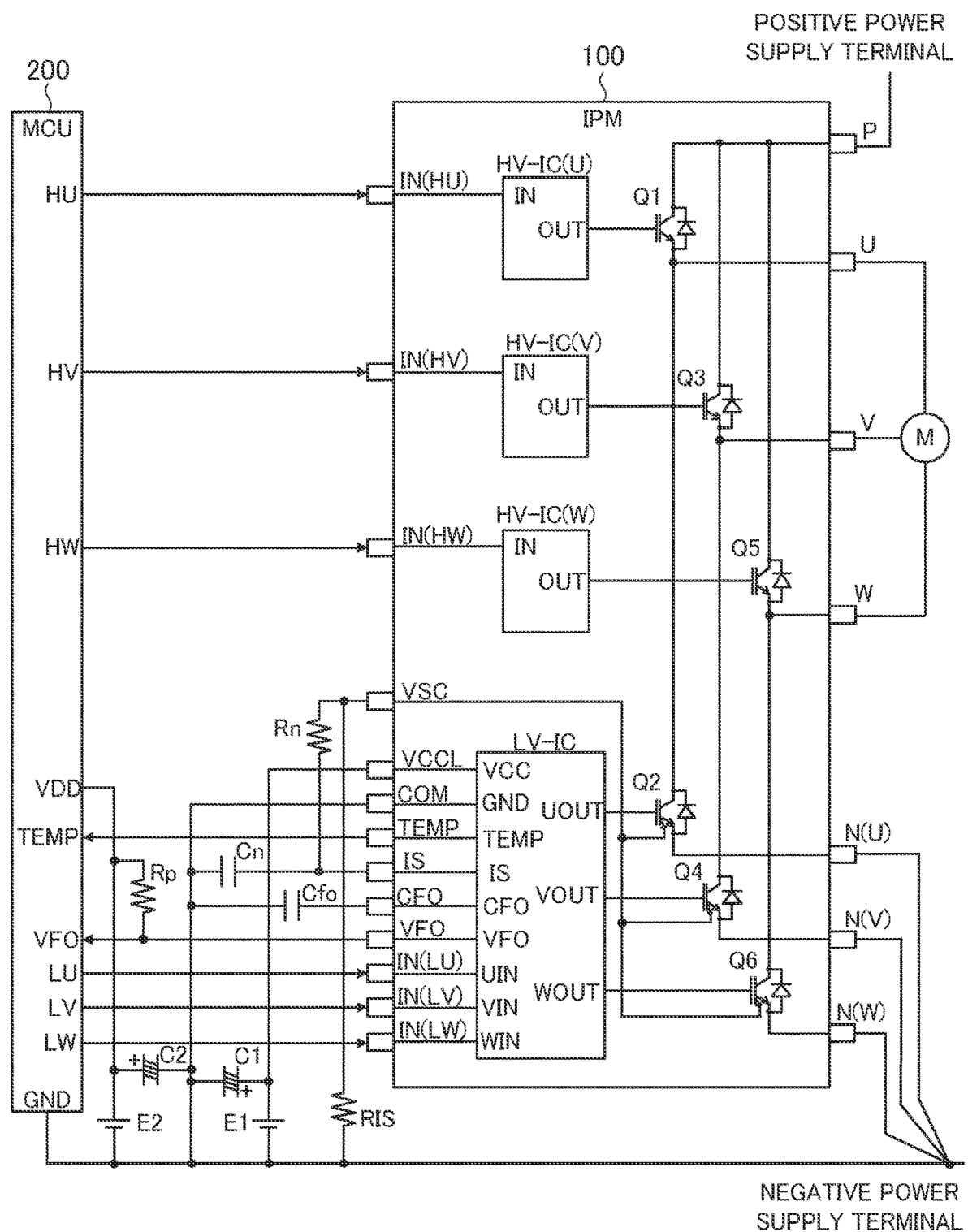
FIG. 4 illustrates an exemplary configuration of a common motor drive device.
Figure 5:
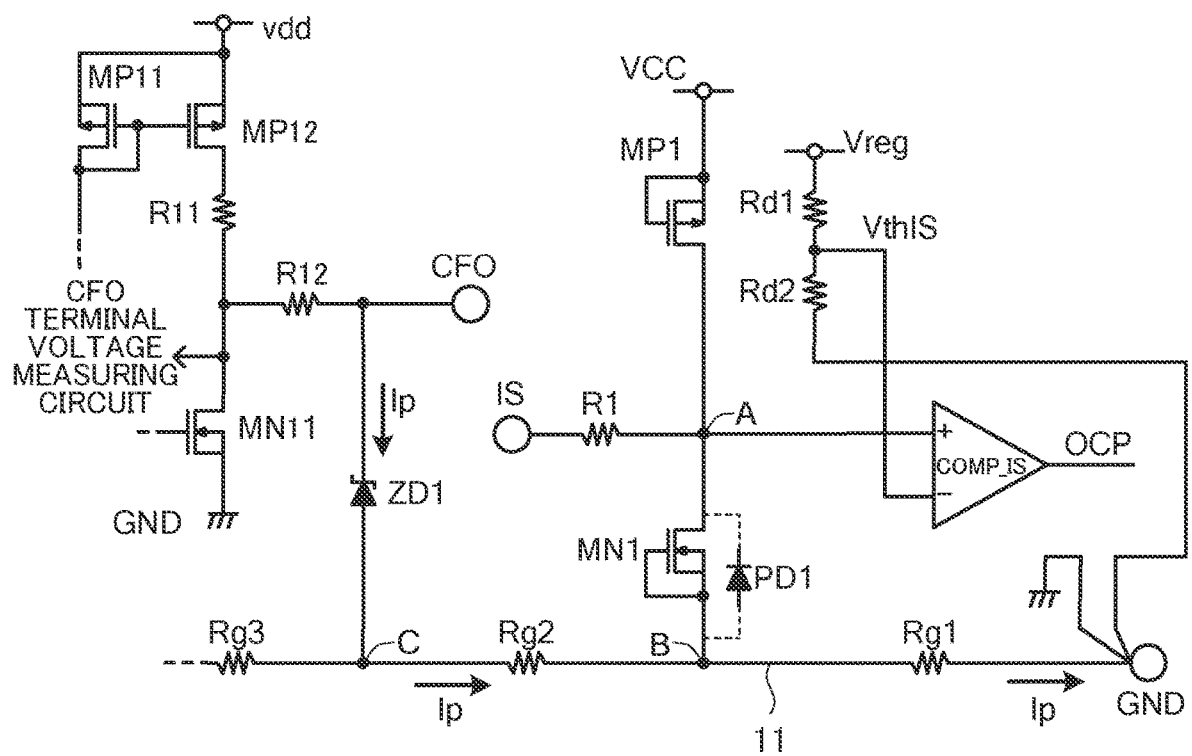
FIG. 5 is a circuit diagram illustrating exemplary terminal protection circuits of a low-voltage side control circuit.
Figure 6:
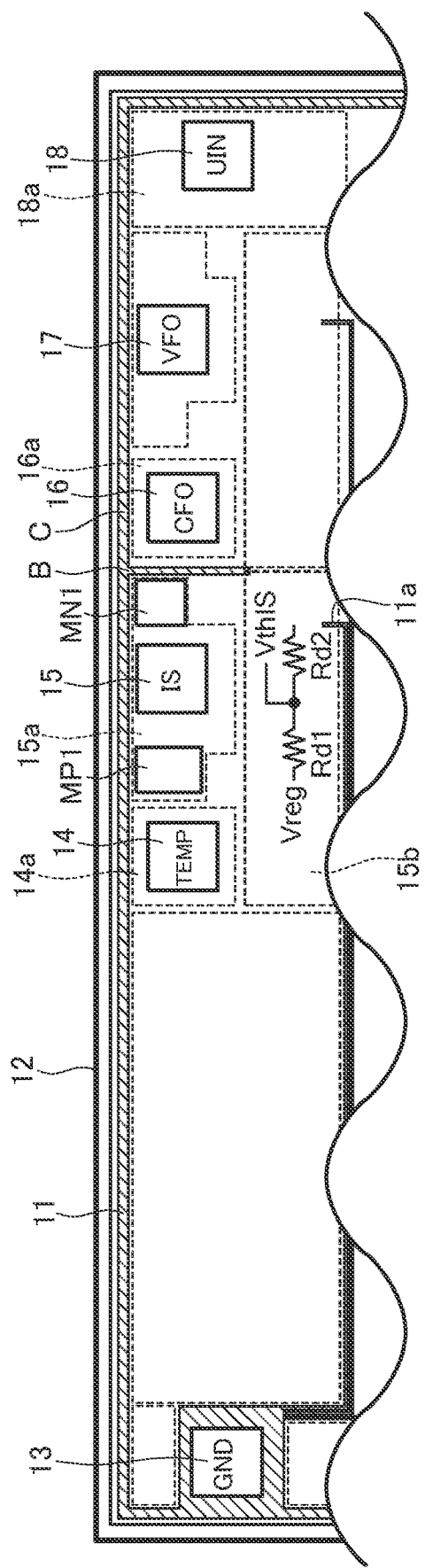
FIG. 6 illustrates an exemplary arrangement on a semiconductor chip of the low-voltage side control circuit.
Figure 7:
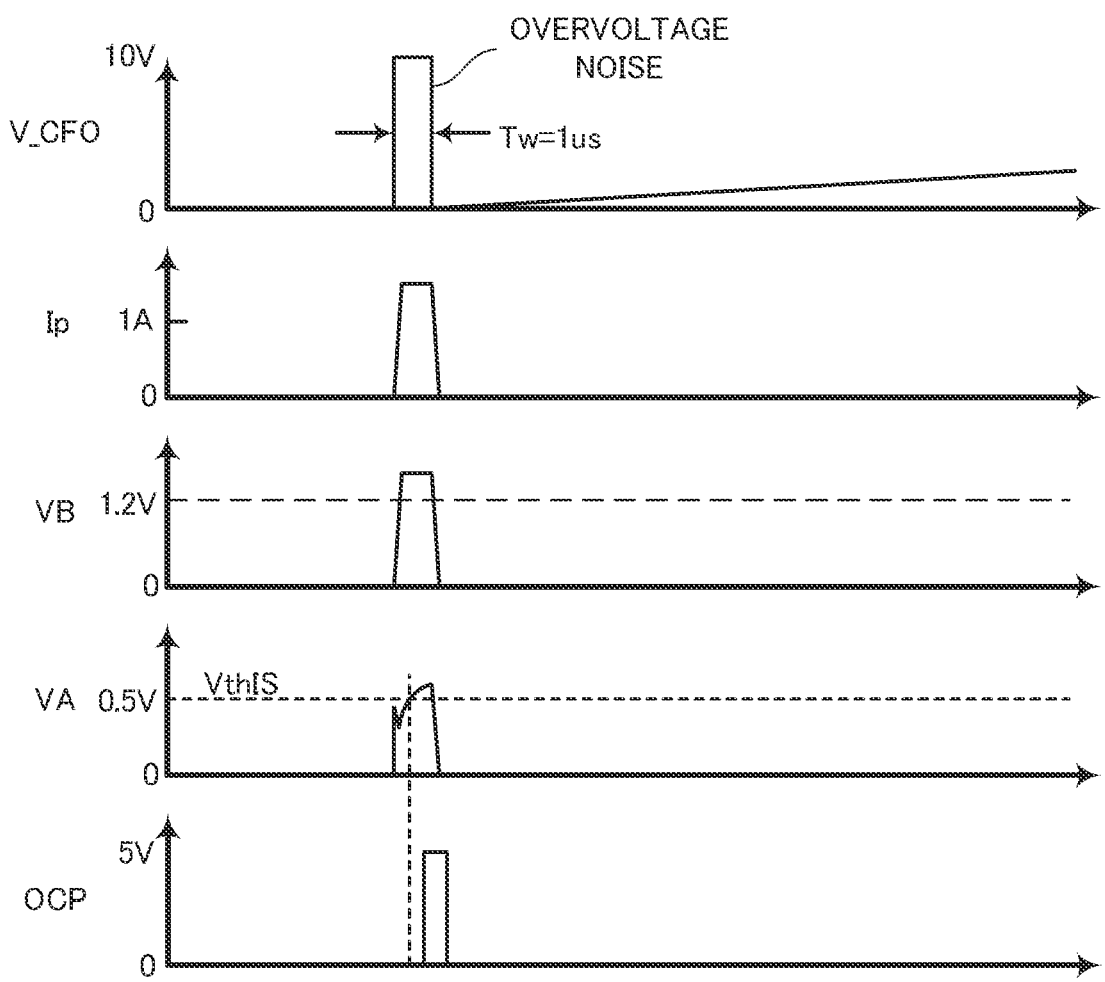
FIG. 7 illustrates operation waveforms of the terminal protection circuits in response to application of an overvoltage.

An embodiment being applied to a low-voltage side control circuit having an overcurrent sensing circuit located away from a pad of a GND terminal along a chip-peripheral ground line will be described below in detail with reference to the accompanying drawings. Note that, in the following description, the low-voltage side control circuit and an IPM including the low-voltage side control circuit are explained with reference to FIG. 4, and like reference numerals are given to like components illustrated in FIGS. 5 and 6 used to explain the conventional technique above.

Figure 1:
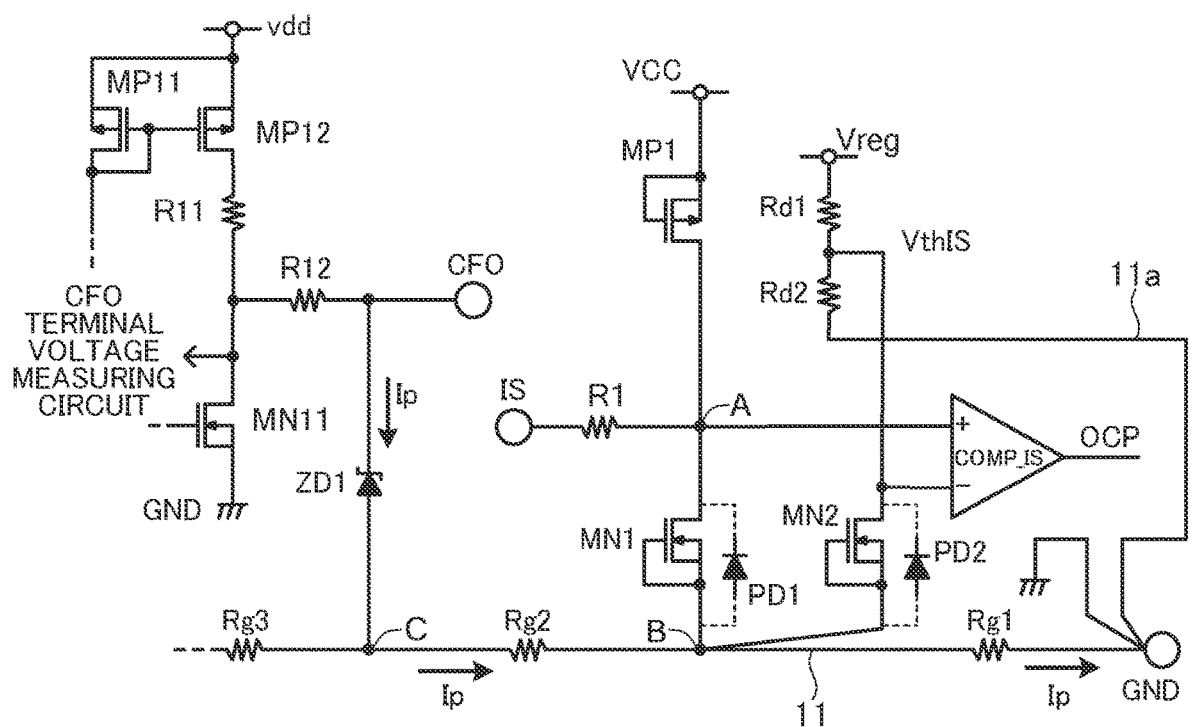
FIG. 1 illustrates exemplary circuit geometry with terminal protection circuits of a low-voltage side control circuit according to an embodiment.
Figure 2:
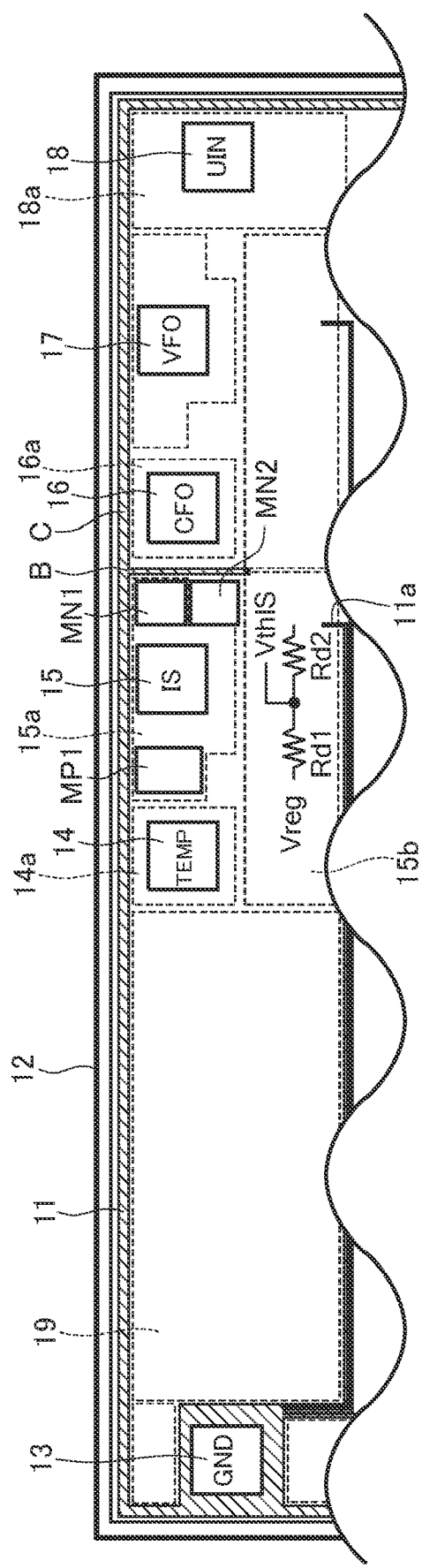
FIG. 2 illustrates an exemplary arrangement on a semiconductor chip of the low-voltage side control circuit according to the embodiment.
Figure 3:
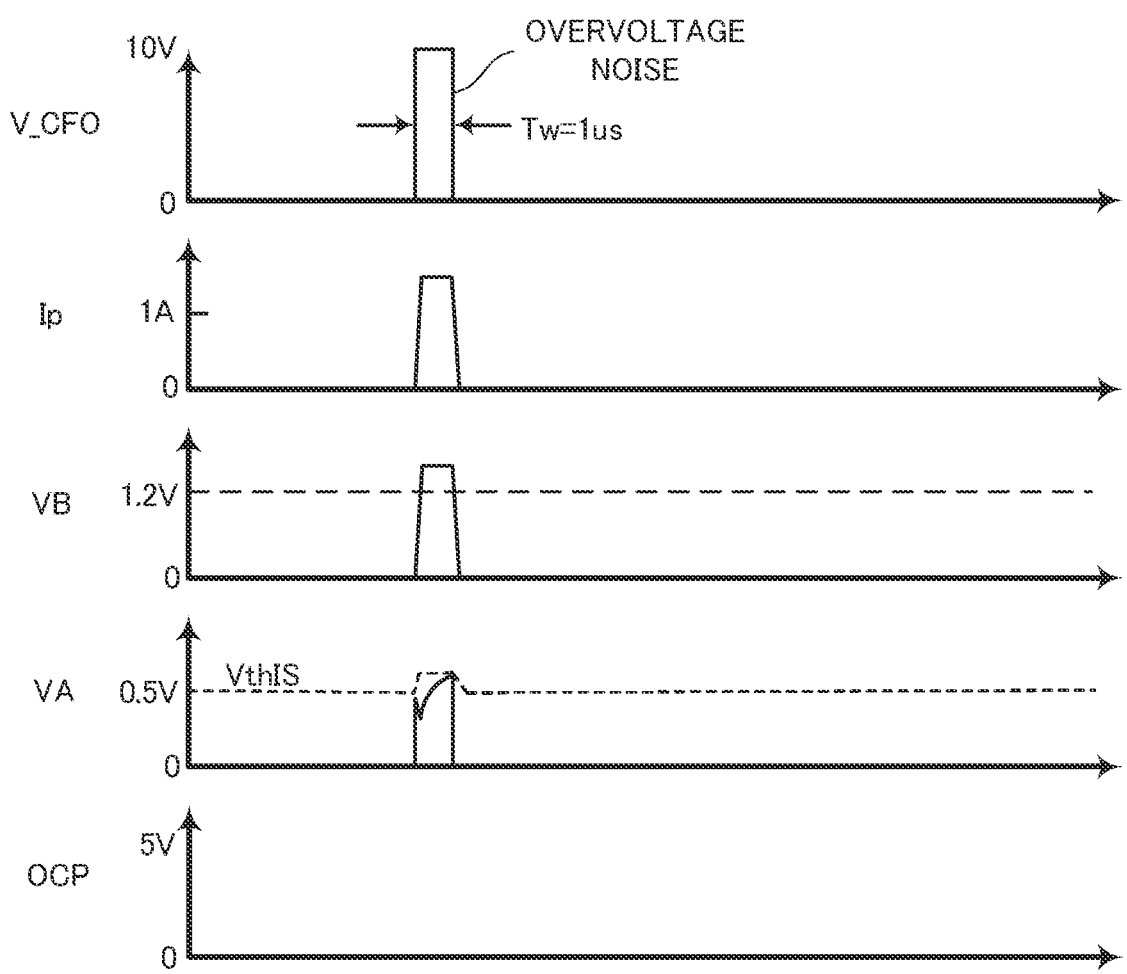
FIG. 3 illustrates operation waveforms of the terminal protection circuits in response to application of an overvoltage according to the embodiment.

FIG. 1 illustrates exemplary circuit geometry with terminal protection circuits of a low-voltage side control circuit according to an embodiment. FIG. 2 illustrates an exemplary arrangement on a semiconductor chip of the low-voltage side control circuit. FIG. 3 illustrates operation waveforms of the terminal protection circuits in response to application of an overvoltage. Note that FIG. 3 depicts, from the top to the bottom, the voltage V_CFO of the CFO terminal; the current Ip flowing into the CFO terminal when the overvoltage is applied; the potential VB at Point B; the potential VA at Point A; and the overcurrent detection signal OCP.

FIG. 1 depicts part of an overcurrent sensing circuit having an IS terminal and a pulse width setting circuit having a CFO terminal, provided in the low-voltage side control circuit LV-IC. In addition, FIG. 2 depicts that the pad 13 (a first pad) of the GND terminal, the pad (a second pad) of the IS terminal, and the pad 16 (a third pad) of the CFO terminal are placed in the stated order along the chip-peripheral ground line 11 of the semiconductor chip 12 of the low-voltage side control circuit LV-IC.

The overcurrent sensing circuit includes, as illustrated in FIG. 1, the IS terminal, the current-limiting protection resistor R1, the transistor MN1 functioning as a first input protection element, the transistor MP1 functioning as a second input protection element, the comparator COMP_IS, the voltage dividing resistors Rd1 and Rd2 for generating the threshold voltage VthIS, and the transistor MN2 functioning as a potential shift element. In the overcurrent sensing circuit, the IS terminal is connected via the current-limiting protection resistor R1 to the non-inverting input terminal of the comparator COMP_IS, and the threshold voltage VthIS is applied to the inverting input terminal of the comparator COMP_IS. The threshold voltage VthIS is generated by a threshold voltage generating circuit including the voltage dividing resistors Rd1 and Rd2. The first terminal of the voltage dividing resistor Rd1 is connected to a line of the voltage Vreg generated in the low-voltage side control circuit LV-IC while the other second terminal of the voltage dividing resistor Rd1 is connected to the first terminal of the voltage dividing resistor Rd2. The other second terminal of the voltage dividing resistor Rd2 is connected to the GND terminal via the in-chip ground line 11a, which is different from the chip-peripheral ground line 11. Herewith, the threshold voltage VthIS is generated by dividing the voltage Vreg by the voltage dividing resistors Rd1 and Rd2.

At Point A on the line, where the protection resistor R1 and the non-inverting input terminal of the comparator COMP_IS are connected to each other, a terminal protection circuit including the transistors MN1 and MP1 is provided. The transistor MN1 is an N-channel MOSFET whose drain is connected to Point A and gate and source are connected to Point B (a first position) on a chip-peripheral ground line 11, located away from the pad 13 (the first pad) of the GND terminal. Note that the diode PD1 connected to the drain and source of the transistor MN1 is a parasitic diode of the transistor MN1. The transistor MP1 is a P-channel MOSFET whose drain is connected to Point A and gate and source are connected to a power source line connected to the VCC terminal of the low-voltage side control circuit LV-IC. The transistor MP1 also has a parasitic diode (not illustrated).

The potential shift element formed of the transistor MN2, which is an N-channel MOSFET, is also connected to the inverting input terminal of the comparator COMP_IS, to which the threshold voltage VthIS is applied. The drain of the transistor MN2 is connected to the inverting input terminal of the comparator COMP_IS while the gate and source thereof are connected to Point B on the chip-peripheral ground line 11, to which the gate and source of the transistor MN1 of the terminal protection circuit are connected. A diode PD2 connected to the drain and source of the transistor MN2 is a parasitic diode of the transistor MN2. Herewith, the threshold voltage VthIS applied to the inverting input terminal of the comparator COMP_IS shifts according to the potential at Point B on the chip-peripheral ground line 11. Note that the transistors MN1 and MN2 used here have the same structure and characteristics.

As for the CFO terminal to which the capacitor Cfo is connected, on the other hand, the cathode of the Zener diode ZD1 that serves as a third input protection element is connected to the CFO terminal. The anode of the Zener diode ZD1 is connected to Point C (a second position), which is located on the peripheral ground line 11 further away from the GND terminal than Point B.

The CFO terminal is also connected to an output of a pulse width setting circuit including, at least, the transistors MP11 and MP12, the resistors R11 and R12, a CFO terminal voltage measuring circuit, and the transistor MN11. The transistors MP11 and MP12 constitute a current mirror circuit where their sources are individually connected to a line of the power source vdd and the gate and drain of the transistor MP11 and the gate of the transistor MP12 are connected to each other, to charge the capacitor Cfo at constant current. The drain of the transistor MP12 is connected to the first terminal of the resistor R11 while the second terminal of the resistor R11 is connected to the first terminal of the resistor R12, the CFO terminal voltage measuring circuit, and the drain of the discharge control transistor MN11. The second terminal of the resistor R12 is connected to the CFO terminal. The source of the transistor MN11 is grounded.

As illustrated in FIG. 2, the chip-peripheral ground line 11 extends along the outer periphery of the semiconductor chip 12 of the low-voltage side control circuit LV-IC. On the left side of FIG. 2, the pad 13 of the GND terminal is provided adjacent to the chip-peripheral ground line 11. In the example of FIG. 2, a control circuit area 19, the protection circuit area 14a, the protection circuit area 15a, the threshold voltage generating circuit area 15b, the protection circuit area 16a, the protection circuit area 18a and the like are arranged inside the chip-peripheral ground line 11.

Within the protection circuit area 14a, the pad 14 of the TEMP terminal is formed at the top, and a Zener diode functioning as a terminal protection circuit is installed in the lower part. Within the protection circuit area 15a, the pad 15 of the IS terminal, the transistors MN1 and MP1 functioning as a terminal protection circuit, and the transistor MN2 functioning as a potential shift element are installed at the top. Within the threshold voltage generating circuit area 15b, the voltage dividing resistors Rd1 and Rd2 constituting a threshold voltage generating circuit are installed. Within the protection circuit area 16a, the pad 16 of the CFO terminal is installed at the top, and the Zener diode ZD1 functioning as a terminal protection circuit is installed in the lower part. Within the protection circuit area 18a, the pad 18 of the UIN terminal and transistors (not illustrated) functioning as a terminal protection circuit are installed at the top.

Because the chip-peripheral ground line 11 is located along the outer periphery of the semiconductor chip 12, Point B at which the gate and source of the transistor MN1 are connected to those of the transistor MN2 is located away from the pad 13 of the GND terminal. Therefore, the wiring resistance Rg1 exists between the pad 13 of the GND terminal and Point B on the chip-peripheral ground line 11. In addition, the anode of the Zener diode ZD1 formed in the protection circuit area 16a is connected to Point C located further away than Point B from the pad 13 of the GND terminal. Therefore, the wiring resistance Rg2 exists between Points B and C on the chip-peripheral ground line 11. Note that, in FIG. 1, part of the chip-peripheral ground line 11 beyond Point C viewed from the pad 13 of the GND terminal is depicted as the wiring resistance Rg3.

Assume that, in the low-voltage side control circuit LV-IC having the above-described configuration, an overvoltage noise, for example, as is illustrated in FIG. 3, is applied to the pad 16 of the CFO terminal. The overvoltage noise is a pulsed voltage V_CFO with the pulse width Tw being 1 μs in the example of FIG. 3. Such an overvoltage is applied to the CFO terminal, and if the overvoltage is higher than the breakdown voltage of the Zener diode ZD1, the current Ip flows through the Zener diode ZD1 and the wiring resistances Rg2 and Rg1 of the chip-peripheral ground line 11 into the pad 13 of the GND terminal. At this time, the current Ip causes a voltage drop across the wiring resistance Rg1, which increases the potential VB at Point B on the chip-peripheral ground line 11. If the potential VB at Point B exceeds a voltage (1.2 V) obtained by adding the forward voltage (e.g. 0.7 V) of the diode PD1, which is a parasitic diode of the transistor MN1, to the threshold voltage VthIS (0.5 V in the example of FIG. 3), the potential VA at Point A rises to 0.5 V or more. At this time, the diode PD2, which is a parasitic diode of the transistor MN2, becomes conductive as with the diode PD1, thereby resulting in also increasing the threshold voltage VthIS (=0.5 V) to 0.5 V or more. Note that the voltage dividing resistors Rd1 and Rd2 for generating the threshold voltage VthIS are set to as high as several tens of kiloohms (kΩ). Herewith, only a very low current flows through the voltage dividing resistors Rd1 and Rd2 via the diode PD2, and the threshold voltage VthIS itself does not therefore exhibit a significant shift.

Thus, with the rise in the potential VB at Point B in response to the application of the overvoltage to the CFO terminal, both inputs of the comparator COMP_IS individually increase to 0.5 V or more. At this time, because being connected to the IS terminal via the protection resistor R1, Point A rises later than the voltage rise of the input to which the threshold voltage VthIS is applied, due to the capacitance of the terminal part, the capacitance of the externally connected resistor-capacitor (RC) filter (the resistor Rn and the capacitor Cn) and the like. This allows the voltage of the input to which the threshold voltage VthIS is applied to be higher than the potential VA at Point A. As a result, the comparator COMP_IS does not produce false detection and therefore outputs no overcurrent detection signal OCP of H level.

If the potential VB at Point B on the chip-peripheral ground line 11, caused in response to application of an overvoltage to the CFO terminal, is less than 1.2 V, the threshold voltage VthIS remains unchanged while the potential VA at Point A rises to no more than 0.5 V. Thus, because the potential VA at Point A does not exceed the threshold voltage VthIS, the comparator COMP_IS does not cause a malfunction.

By the use of the overcurrent sensing circuit having a potential shift element formed of the transistor MN2, when the potential VB at Point B on the chip-peripheral ground line 11 rises and then the potential VA at Point A near the IS terminal exceeds the threshold voltage VthIS, the threshold voltage VthIS is raised in a similar fashion. Herewith, it is possible to prevent false detection of an overcurrent in the event of application of an overvoltage which causes the potential VB at Point B on the chip-peripheral ground line 11 to increase. This leads to improved overvoltage noise tolerance of the drive device.

As for the chip-peripheral ground line 11, there is no need to reduce the wiring resistance, for example, by increasing the width and thickness thereof. Therefore, the wiring area may be reduced, for example, by reducing its width, which results in a reduction in chip cost.

The embodiment described above uses, as the terminal protection circuit for the CFO terminal, a Zener diode embedded below the pad of the CFO terminal without an input protection resistor for limiting input current. Herewith, the element area of the terminal protection circuit is reduced, which results in a reduction in chip cost.

Further, it is preferable that a terminal for handling a signal with low detection voltage, like the IS terminal, be located as close as possible to the GND terminal; however, the provision of the potential shift element eases restrictions on the terminal arrangement.

According to the above-described embodiment, the potential shift element is formed of the N-channel transistor MN2; however, it is not limited to the N-channel transistor MN2. Instead, the potential shift element may be formed of a diode or a Zener diode whose anode is connected to Point B on the chip-peripheral ground line 11. In this case, it is desirable to also replace the transistor MN1 with a diode or a Zener diode in order to match characteristics between the potential shift element and the element provided between Points A and B.

According to the terminal protection circuit of a semiconductor chip of the above-described embodiment, even if the potential at the first position on the chip-peripheral ground line rises due to an overvoltage being applied to a different terminal, both inputs of the comparator undergo similar potential increases. As a result, the comparator causes no malfunction in response to the application of the overvoltage.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A terminal protection circuit of a semiconductor chip, comprising:
    a first pad serving as a ground terminal of the semiconductor chip;
    a chip-peripheral ground line extending along an outer periphery of the semiconductor chip, and configured to be connected to the first pad; and
    an overcurrent sensing circuit, including:
        a second pad serving as an input terminal of the semiconductor chip, for receiving a current detection signal,
        a threshold voltage generating circuit for generating a threshold voltage,
        a comparator having an inverting input terminal and a non-inverting input terminal that are respectively connected to the threshold voltage generating circuit and the second pad, the comparator comparing the current detection signal and the threshold voltage received respectively at the non-inverting and inverting input terminals,
        a first input protection element connected between the second pad and a first position on the chip-peripheral ground line, and
        a potential shift element, which is a metal-oxide-semiconductor field-effect transistor (MOSFET), connected between the inverting input terminal of the comparator and the first position on the chip-peripheral ground line, the potential shift element shifting the threshold voltage to be applied to the comparator according to a potential at the first position.

2. The terminal protection circuit according to claim 1, wherein:
    each of the first input protection element and the potential shift element is an N-channel MOSFET, which has a gate terminal and a source terminal that are connected to the first position on the chip-peripheral ground line.

3. The terminal protection circuit according to claim 1, wherein:
    the overcurrent sensing circuit further includes a second input protection element connected between a power source and the non-inverting input terminal of the comparator.

4. The terminal protection circuit according to claim 3, wherein:
    the second input protection element is a P-channel MOSFET, which has a gate terminal and a source terminal that are connected to the power source.

5. The terminal protection circuit according to claim 1, further comprising:
    a third pad located farther away from the first pad than the second pad,
    a second position on the chip-peripheral ground line, the second position being farther away from the first pad than the first position thereon, and
    a third input protection element connected between the third pad and the second position on the chip-peripheral ground line.

6. The terminal protection circuit according to claim 5, wherein:
    the third input protection element is a Zener diode, of which an anode is connected to the second position on the chip-peripheral ground line.

7. A drive device for driving a motor, comprising:
    the semiconductor chip having the terminal protection circuit in claim 1.

* * * * *